United States Patent [19]

Blanchard, Jr.

[11] 4,428,020
[45] Jan. 24, 1984

[54] POWER SUPPLY SENSING CIRCUITRY

[75] Inventor: Raymond A. Blanchard, Jr., Freeville, N.Y.

[73] Assignee: SCM Corporation, New York, N.Y.

[21] Appl. No.: 311,225

[22] Filed: Oct. 14, 1981

[51] Int. Cl.³ .......................... H02H 3/20; H02H 3/24
[52] U.S. Cl. ........................................ 361/90; 361/88; 361/86; 361/18; 361/92; 307/200 A; 340/660; 340/661; 340/662; 340/663
[58] Field of Search ................. 361/90, 88, 92, 86, 361/18, 91, 187, 87; 328/146, 147; 307/200 A, 354–358, 360, 362; 340/660–663; 363/57; 364/119

[56] References Cited

U.S. PATENT DOCUMENTS

| | | | |
|---|---|---|---|
| 3,679,965 | 7/1972 | Wilkinson | 361/90 X |
| 3,757,202 | 9/1973 | Prouty et al. | 361/92 X |
| 3,764,883 | 10/1973 | Staad et al. | 361/86 X |
| 3,800,198 | 3/1974 | Graf et al. | 363/57 X |
| 3,843,907 | 10/1974 | Genuit et al. | 361/87 |
| 3,918,043 | 11/1975 | Beck | 361/187 X |
| 3,931,547 | 1/1976 | Glogolja | 361/86 |
| 4,245,150 | 1/1981 | Driscoll et al. | 361/92 X |

*Primary Examiner*—Patrick R. Salce
*Attorney, Agent, or Firm*—Armand G. Guibert; Ernest F. Weinberger

[57] ABSTRACT

Power supply sensing circuitry comprises a first comparator for determining whether the power supply potential voltage exceeds by a predetermined amount the voltage required to operate a data processing system connected to the power supply potential, and a second comparator for determining whether the power supply potential is at least the voltage required to operate the connected data processing system.

7 Claims, 2 Drawing Figures

POWER SUPPLY SENSING CIRCUITRY

CROSS-REFERENCES TO RELATED APPLICATION

There are no presently pending related patent applications.

BACKGROUND OF THE INVENTION

1. Field of the Invention

The power supply sensing circuitry of the present invention is used in conjunction with data processing systems such as but not limited to data processing systems which control the functions of typewriters and other office equipment machines. The present invention is concerned with circuitry for determining whether the power supply is in a brown out or power down condition.

2. Description of the Prior Art

Prior art patents concerned with power line supply sensing circuitry include the Putterman et al patent, U.S. Pat. No. 3,624,617, which discloses a protection circuit for a computer memory having a plurality of power sources 20, 21 and 22, as seen in FIG. 2. The outputs of the power sources are ANDed by gate 28 to control the system. In particular, each power supply includes a detector transistor comprising transistors 58, 78 and 89 in FIG. 4a, which turns ON or OFF depending on whether the mechanical power source is functioning properly. Diodes 101, 102 and 103, and resistor 105 form a conventional AND gate. If one of the power sources fails or is disrupted, the AND gate produces a power failure signal which inhibits various computer operations.

Another such patent is the Pollitt patent, U.S. Pat. No. 3,757,302, which discloses a power failure detection system that automatically monitors the supply voltage to indicate a power fail condition. In FIG. 1, there is shown a primary A.C. power source 10 which is rectified by rectifier 14 and filtered by filter 16. The resulting voltage is applied to one input of a comparator 20, the other input thereto is supplied by a reference voltage. The comparator 20 thereby provides an output whenever the supply voltage is below the minimum acceptable level of the power source 10.

A patent to Graf et al, U.S. Pat. No. 3,800,198, shows an overvoltage and undervoltage prevention system for a motor controller. The voltage from the power supply between points 22 and 24 provides a sensed voltage on line 72 via voltage signal generation 70 to overvoltage detector 74 and undervoltage detector 80. The positive voltage on 72 is compared with two fixed negative voltages 108 and 128 (FIG. 2). If the positive voltage on 72 and appropriate voltage divider is below the voltage set by 108, a positive voltage is provided at 78 and if it is above the voltage set by 128 and appropriate voltage divider, a positive voltage is set at 84. Stop signal generator monitors the sum of these voltages at 86 and provides a positive in-range signal at 92 when both signals are present at 86. If the input at 72 is too high, the output on 78 is negative. If the input at 72 is too low, the output on 84 is ground, for reduction of either of the output signals at 86 will cause stop generator 90 to provide a grounded output. Circuits 74 and 80 are comparator circuits and circuit 90 is an AND gate monitoring the output of these comparator outputs to provide a window detector.

Another prior art patent, U.S. Pat. No. 3,918,043, to Beck is also concerned with power line sensing circuitry. The Beck patent discloses a power supply monitor which senses the loss of the primary power supply signal through voltage detector 34. The threshold voltage is determined by zener diode 32.

Another such patent is the Driscoll et al patent, U.S. Pat. No. 4,245,150, which discloses a power line disturbance detector circuit that includes a comparator 26 for comparing primary AC power to a DC reference voltage provided by a voltage regulator. The AC supply voltage is rectified and filtered by diode 32 and capacitor 34. Resistors 36, 38 form a voltage divider such that the resulting voltage is applied to the non-inverted input of comparator 41. The inverted input of the comparator 41 is the output of voltage regulator 30. The comparator generates a reset pulse once during each AC cycle as long as the AC voltage exceeds the DC reference voltage. If this condition is not met, a power line disturbance signal is generated.

Another related patent is the Genuit et al, U.S. Pat. No. 3,843,907, which discloses an adjustable current detector that monitors the current delivered by each section of a multisection switching regulator. The currents are monitored by comparators 64a and 64b, the outputs of which are ORed together by OR gate 66. If either section of the regulator becomes defective, the output of the OR gate will go high to disable the circuit.

None of the aforementioned patents, however, disclose a power supply sensing circuitry embodying the present invention wherein a first comparator determines whether the power supply potential exceeds by a predetermined amount the minimum voltage required to operate a data processing system connected to the power supply, and a second comparator determines whether the power supply potential is at least the voltage required to operate the connected data processing system.

SUMMARY OF THE INVENTION

The present invention is a power supply sensing circuitry which includes a first comparator for determining whether the power supply potential (i.e. the stepped down and full wave rectified power line voltage) exceeds by a predetermined amount the voltage required to operate a data processing system connected to the power supply. If the power supply potential exceeds the voltage required to operate the connected data processing system by a predetermined amount, then the power supply potential is normal. If the power supply potential does not exceed the voltage required to operate the data processing system by the predetermined amount, then the power supply potential is in a brown out or power down condition. In such an event, means may be provided in the data processing system to cause the typewriter or other machine associated with the data processing system to cease operations. Means may also be provided in the data processing system to discontinue control of the associated machine in the event of such a brown out or power down condition.

For a certain type of three-terminal voltage regulator, the output voltage from the voltage regulator is zero volts when the supply potential is less than the voltage regulator rating. In this condition, although the first comparator would indicate that the power supply potential exceeds the output voltage by the predetermined amount, the power supply potential, since it was less than the voltage regulator rating, is inadequate to permit proper functioning of the connected data processing system. Therefore, a second comparator is provided which determines whether the power supply potential is at least the voltage required to operate the connected data processing system.

BRIEF DESCRIPTION OF THE DRAWING

A more detailed understanding of the principles and embodiments of the present invention will be evident from the following description taken in conjunction with the appended drawing in which.

DESCRIPTION OF THE PREFERRED EMBODIMENT

Figure 1:
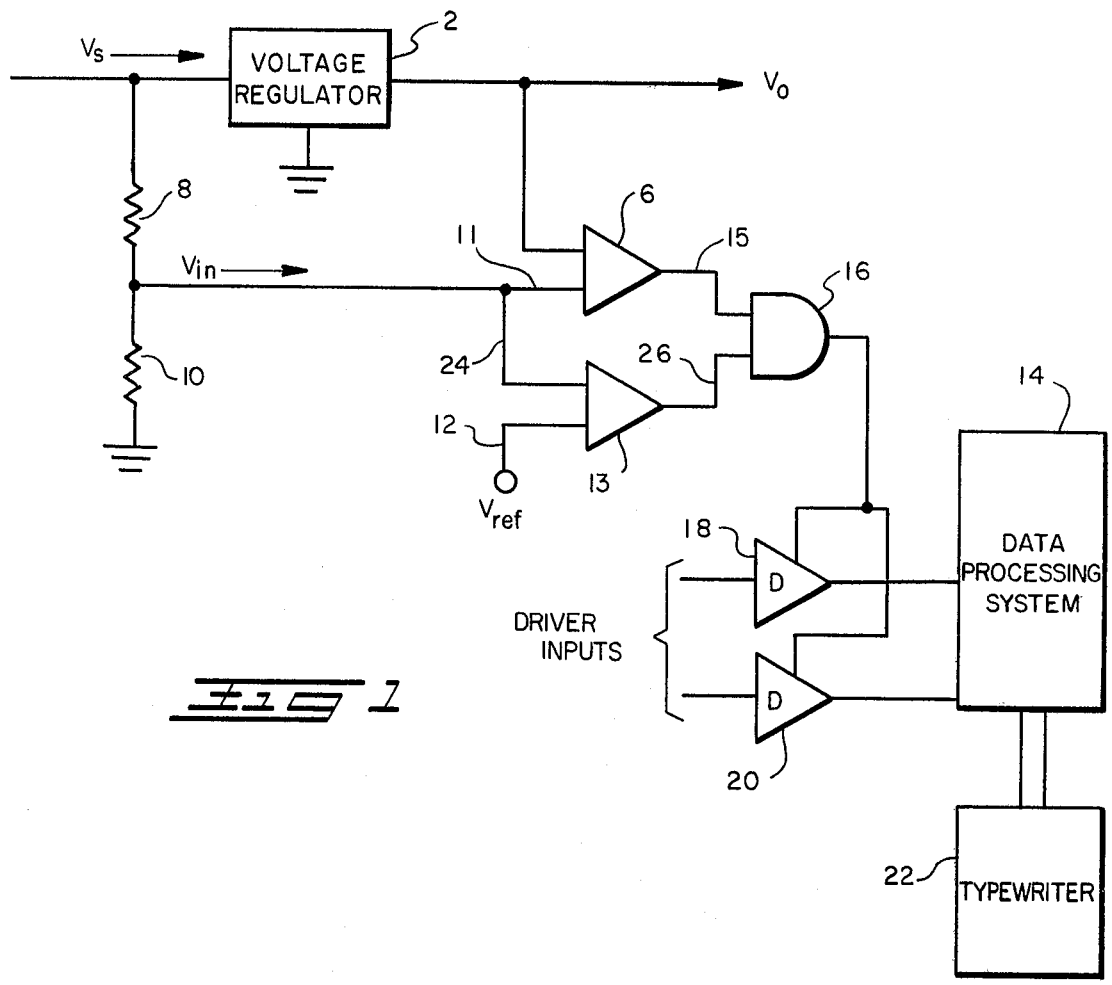
FIG. 1 is a schematic diagram of the power supply sensing circuitry constructed in accordance with the present invention; and, FIG. 2 is a graphic illustration of the input/output relationship for a particular three-terminal voltage regulator with which the present invention may be used.
Figure 2:
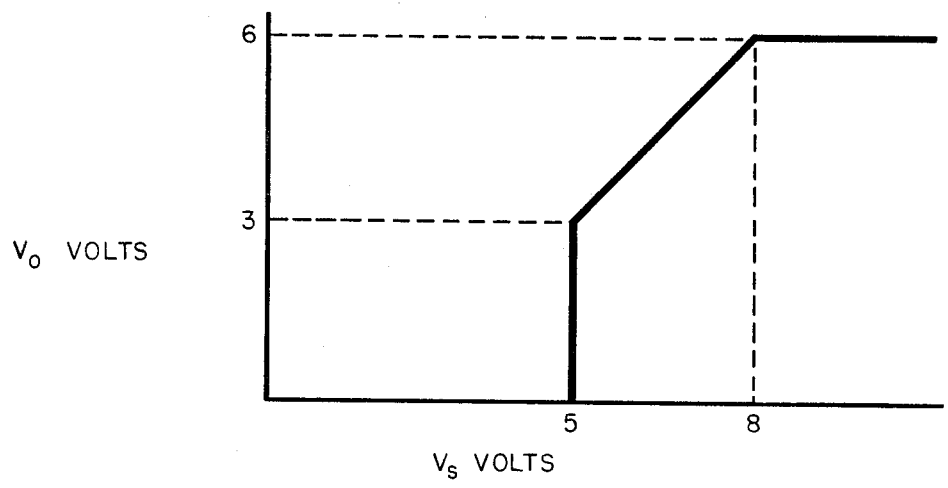

Referring to FIG. 1, a three-terminal voltage regulator 2 is connected to a power supply potential, designated $V_s$. Voltage regulator 2 may be, for example, a 6 volt linear regulator of the type sold by Texas Instrument of Dallas, Tex., under model designation 78MO600. The characteristics of voltage regulator 2 are such that as long as the power supply potential $V_s$ to voltage regulator 2 (referred to hereinafter as "regulator 2" for brevity and clarity) exceeds the input voltage at which the regulator 2 is rated, the output voltage $V_o$ from regulator 2 will be that at which regulator 2 is rated. For example, if regulator 2 is a 6 volt unit, and the power supply potential to regulator 2 is 6 volts or greater, the output voltage from regulator 2 will be 6 volts. When, however, the power supply potential is less than the voltage at which the regulator 2 is rated, the output voltage from regulator 2 will be zero volts. For example, if regulator 2 is a 6 volt unit and the power supply potential to regulator 2 is less than six volts, the output voltage from regulator 2 will be zero volts. The foregoing characteristics for the case when regulator 2 is a 6 volt unit, are shown graphically in FIG. 2 wherein $V_s$ is the power supply potential to regulator 2 and $V_o$ is the corresponding output voltage.

The output voltage from regulator 2 is the input 5 to a first comparator 6 which may be, for example, a comparator amplifier. A voltage divider consisting of resistors 8 and 10 applies a predetermined percentage, $V_{in}$, of the power supply potential $V_s$ to input 11 of first comparator 6.

The reference voltage input 12 to a second comparator 13, which may also be a comparator amplifier, is a voltage, for example a DC source, which is just less than the minimum voltage required for operating the data processing system, 14. In a preferred embodiment the data processing system, 14, is embodied in a large scale integrated circuit chip.

First comparator 6 is tripped and sends out a true (logical one) signal or pulse to input 15 of AND gate 16 only when the power supply potential $V_s$ to regulator 2 exceeds the output voltage $V_o$ from regulator 2 by a predetermined amount. For example, in a preferred embodiment, first comparator 6 is tripped and sends out a true (logical one) signal to input 15 of AND gate 16 only when the power supply potential $V_s$ exceeds the 6 volt output voltage $V_o$ by at least two volts, the predetermined amount. The values of resistors 8 and 10 are chosen so that the voltage input $V_{in}$ to input 11 of comparator 6 will be the same as or exceed the voltage output $V_o$ from regulator 2 when the power supply potential $V_s$ exceeds the voltage output $V_o$ by the predetermined amount. When the voltage input $V_{in}$ to comparator 6 is the same or exceeds the voltage output $V_o$ to comparator 6 (i.e. the condition when power supply potential $V_s$ exceeds the voltage output $V_o$), comparator 6 sends out a true (logical one) signal to AND gate 16. In a preferred embodiment, wherein the voltage output $V_o$ regulator 2 is 6 volts, and the predetermined amount by which the power supply potential must exceed the voltage output $V_o$ is 2 volts, the values of resistors 8 and 10, which are precision resistors of 1% accuracy, are 1 kohm and 1.5 kohm, respectively. In such a preferred embodiment, when the power supply is normal and transmitting a potential $V_s$ of approximately 15 volts, first comparator 6 is tripped and sends out a true (logical one) signal to input 15 of AND gate 16. When, however, there is a brown out or power down and the power supply potential $V_s$ drops below 8 volts, so that the supply voltage does not exceed the output voltage by two volts, first comparator 6 is not tripped. It should be noted that although the data processing system, 14, of the preferred embodiment can be safely operated with a power supply potential between 8 volts and 6 volts, the fact that the power supply potential is so close to the output voltage, i.e. within two volts, is taken to mean that an unsafe condition such as a brown out or a power down is present, and therefore first comparator 6 is not tripped.

AND gate 16 does not provide an output signal to drivers 18 and 20 unless AND gate 16 receives true (logical one) signal or pulses from both comparator 6 and comparator 13. If drivers 18 and 20 do not receive output signals from AND gate 16, then, for example, the data processing system 14 may cause the typewriter 22, or other machine associated with the data processing system 14 to cease operating, and/or the data processing system 14 may discontinue control of the associated typewriter 22, or other machine.

As previously mentioned, when the power supply potential to regulator 2 is less than the voltage at which the voltage regulator is rated, the output voltage from regulator 2 is zero volts. In such a case the power supply potential to regulator 2 may not exceed the output voltage by the required amount, and yet the first comparator 6 would be tripped. For example, in the preferred embodiment, if the power supply potential to regulator 2 is 4 volts, comparator 6 would be tripped because the power supply potential, 4 volts, would exceed the output voltage, zero volts, by more than two volts. It is undesirable, however, to supply power to data processing system 14 when the power supply potential is less than six volts.

Therefore, the second comparator 13 is employed for the purpose of determining whether the power supply potential is at least the voltage required to operate the connected data processing system. In the case of a preferred embodiment in which the power supply potential is at least six volts, the second comparator 13, which may be a comparator amplifier (as previously mentioned), determines whether the input voltage, $V_{in}$, which is a predetermined percentage of the power supply potential $V_s$, is at least 6 volts. If input voltage, $V_{in}$, is at least 6 volts, then the power supply potential $V_s$ is also at least 6 volts. In such a preferred embodiment, a 5 volt reference voltage which may be a DC voltage is the input 12 to comparator 13, while the input 24 to comparator 13 is the voltage $V_{in}$. If comparator 13 determines that the input voltage $V_{in}$ is at least 6 volts, then power supply potential $V_s$ is also at least 6 volts, and comparator 13 is tripped and sends a logical one signal or pulse to input 26 of AND gate 16. If comparator 13 determines that the input voltage, $V_{in}$, is not at least 6 volts, then it is presumed that the power supply potential $V_s$ is also not at least 6 volts, and comparator 13 is not tripped.

When both comparator 6 is tripped and sends a true (logical one) signal to AND gate 16 because the power supply potential to voltage regulator 2 exceeds the output voltage from voltage regulator 2 by the predetermined amount, and comparator 13 is tripped and sends a true (logical one) signal to AND gate 16 because the power supply potential is at least the voltage required to operate the connected data processing system, then AND gate 16 provides an output signal which enables drivers 18 and 20 to provide voltages to data processing system 14. Conversely, when either comparator 6 or comparator 13 is not tripped, AND gate 16 does not provide an output signal to drivers 18 and 20 and voltage is not provided to data processing system 14.

As previously mentioned, means may be provided in data processing system 14 to cause the machine associated with the data processing system 14 to cease operating, and/or the data processing system 14 to discontinue control of the associated machine, when voltages are not provided to the data processing system 14 by drivers 18 and 20.

In a preferred embodiment of the present invention comparators 6 and 13, AND gate 16 and drivers 18 and 20, and their related circuitry are included in a large scale integrated circuit chip and voltage regulator 2 is part of the power supply to the large scale integrated circuit chip.

Variations and modifications including but not limited to those discussed above will occur to those skilled in the art once they are made aware of the basic concepts of the invention. Therefore, it is intended that the appended claims shall be construed to include not only the embodiments expressly described above, but all other variations and modifications as fall within the true spirit and scope of the invention.

Having thus described my invention, what I claim as new, and desire to secure by Letters Patent is:

1. Power supply sensing circuitry for a data processing system comprising:
   a first comparator for comparing the power supply potential at the input to a voltage regulator with the output voltage from the voltage regulator, and for producing a signal when the supply voltage exceeds the output volage by a predetermined amount;
   a second comparator for comparing the power supply potential with a reference voltage and for producing a signal when the power supply potential is at least the voltage required to operate the data processing system;
   driver means for providing voltages to the data processing system; and,
   means for enabling the driver means when a said signal is produced by both the first comparator and the second comparator.

2. Power supply sensing circuitry as set forth in claim 1 which includes a voltage divider means for applying a predetermined percentage of the power supply potential to the first comparator.

3. Power supply sensing circuitry as set forth in claim 2 wherein the first comparator comprises a first comparator amplifier whose reference voltage input is the output voltage from the voltage regulator.

4. Power supply sensing circuitry as set forth in claim 1 which includes a voltage divider means for applying a predetermined percentage of the power supply potential to the second comparator.

5. Power supply sensing circuitry as set forth in claim 1 wherein the second comparator comprises a second comparator amplifier whose reference voltage input is a DC voltage source.

6. Power supply sensing circuitry as set forth in claim 1 wherein the voltage regulator is a three-terminal voltage regulator.

7. Power supply sensing circuitry as set forth in claim 1 wherein the means for enabling the driver means when said signal is produced by both the first comparator circuit and the second comparator circuit is an output signal from an AND gate.

* * * * *